US012633874B2

(12) United States Patent
Ergun et al.

(10) Patent No.: US 12,633,874 B2
(45) Date of Patent: May 19, 2026

(54) SWITCHABLE ACTIVE ELEMENT FOR INDUCTOR-CAPACITOR (LC) VOLTAGE CONTROLLED OSCILLATOR

(71) Applicant: QUALCOMM Incorporated, San Diego, CA (US)

(72) Inventors: Burcin Serter Ergun, Poway, CA (US); Jose Luis Sanchez, Chula Vista, CA (US); Sajin Mohamad, San Diego, CA (US); Zhiqin Chen, San Diego, CA (US); Ashwith Jerome Rego, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/938,191

(22) Filed: Nov. 5, 2024

(65) Prior Publication Data

US 2026/0128712 A1 May 7, 2026

(51) Int. Cl.
H03B 5/04 (2006.01)
H03B 5/12 (2006.01)

(52) U.S. Cl.
CPC ............. H03B 5/04 (2013.01); H03B 5/1212 (2013.01); H03B 2200/0088 (2013.01)

(58) Field of Classification Search
CPC ......................................................... H03B 5/04
USPC ..................................................... 331/117 FE
See application file for complete search history.

(56) References Cited

U.S. PATENT DOCUMENTS

| | | | |
|---|---|---|---|
| 8,022,778 | B2 | 9/2011 | Nagaraj et al. |
| 11,353,903 | B1 * | 6/2022 | Coban ..................... G05F 1/445 |
| 2009/0289732 | A1 | 11/2009 | Miyashita |
| 2016/0036382 | A1 | 2/2016 | Chakraborty |
| 2017/0054413 | A1 | 2/2017 | Djahanshahi et al. |
| 2017/0104453 | A1 * | 4/2017 | Iotti et al. ................ H03B 1/00 |
| 2020/0177126 | A1 * | 6/2020 | Liu ....................... H03B 5/1212 |
| 2023/0155549 | A1 * | 5/2023 | Familia ................ H03B 5/1243 |
| | | | 331/34 |

OTHER PUBLICATIONS

International Search Report and Written Opinion—PCT/US2025/052107—ISA/EPO—Feb. 2, 2026.

* cited by examiner

*Primary Examiner* — Joseph Chang
(74) *Attorney, Agent, or Firm* — Loza & Loza, LLP

(57) ABSTRACT

An apparatus, comprising: a first upper voltage rail; a lower voltage rail; a set of voltage controlled oscillator (VCO) active cores, wherein one or more of the set of VCO active cores is selectively coupled to the first upper voltage rail based on a control signal, wherein the set of the VCO active cores are coupled to the lower voltage rail or the one or more of the set of VCO active cores is selectively coupled to the lower voltage rail based on the control signal; and a tank circuit coupled to the set of VCO active cores.

18 Claims, 9 Drawing Sheets

900

910

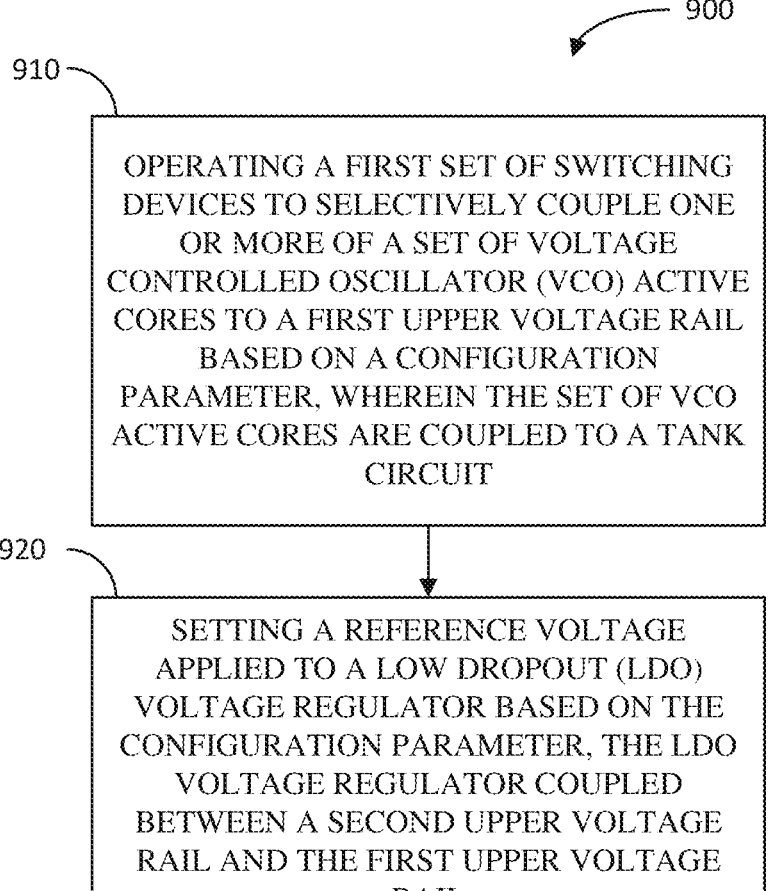

OPERATING A FIRST SET OF SWITCHING DEVICES TO SELECTIVELY COUPLE ONE OR MORE OF A SET OF VOLTAGE CONTROLLED OSCILLATOR (VCO) ACTIVE CORES TO A FIRST UPPER VOLTAGE RAIL BASED ON A CONFIGURATION PARAMETER, WHEREIN THE SET OF VCO ACTIVE CORES ARE COUPLED TO A TANK CIRCUIT

920

SETTING A REFERENCE VOLTAGE APPLIED TO A LOW DROPOUT (LDO) VOLTAGE REGULATOR BASED ON THE CONFIGURATION PARAMETER, THE LDO VOLTAGE REGULATOR COUPLED BETWEEN A SECOND UPPER VOLTAGE RAIL AND THE FIRST UPPER VOLTAGE RAIL

FIG. 9

SWITCHABLE ACTIVE ELEMENT FOR INDUCTOR-CAPACITOR (LC) VOLTAGE CONTROLLED OSCILLATOR

FIELD

This disclosure relates generally to oscillators, and in particular, to a voltage controlled oscillator (VCO) including a set of selectively activated VCO active cores for setting power consumption and supply noise characteristics.

BACKGROUND

A voltage controlled oscillator (VCO) is configured to generate a clock signal for many different purposes. The phase noise of the clock signal may be adversely affected by noise present on the supply voltage provided to the VCO. Further, the VCO also consumes power based on the supply voltage. The supply noise and power consumption of a VCO may also be affected based on process variation of the particular integrated circuit (IC) chip received post-silicon. Lower VCO power consumption and lower supply voltage noise for post-silicon IC chips may be desirable.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a first upper voltage rail; a lower voltage rail; a set of voltage controlled oscillator (VCO) active cores, wherein one or more of the set of VCO active cores is selectively coupled to the first upper voltage rail based on a control signal, wherein the set of the VCO active cores are coupled to the lower voltage rail or the one or more of the set of VCO active cores is selectively coupled to the lower voltage rail based on the control signal; a tank circuit coupled to the set of VCO active cores.

Another aspect of the disclosure relates to a method. The method includes: operating a first set of switching devices to selectively couple one or more of a set of voltage controlled oscillator (VCO) active cores to a first upper voltage rail based on a configuration parameter, wherein the set of VCO active cores are coupled to a tank circuit; and setting a reference voltage applied to a low dropout (LDO) voltage regulator based on the configuration parameter, the LDO voltage regulator coupled between a second upper voltage rail and the first upper voltage rail.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 9 illustrates a flow diagram of an example method of generating a clock signal in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
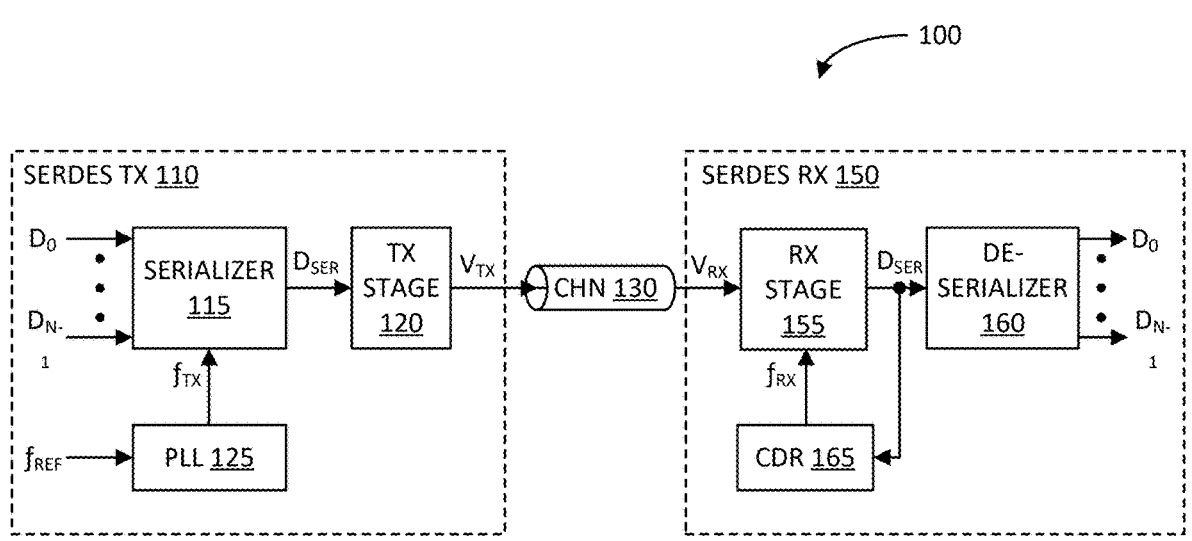
FIG. 1 illustrates a block diagram of an example serializer/deserializer (SERDES) data communication system in accordance with an aspect of the disclosure.

FIG. 1 illustrates a block diagram of an example serializer/deserializer (SERDES) data communication system 100 in accordance with an aspect of the disclosure. The SERDES data communication system 100 includes a SERDES transmitter (Tx) 110 coupled to a SERDES receiver (Rx) 150 via a communication channel 130. In this example, the SERDES data communication system 100 is shown to include a single unidirectional data lane. However, it shall be understood that the SERDES data communication system 100 may include a set of unidirectional and/or bidirectional data lanes.

The SERDES transmitter 110 includes a serializer 115, a transmit (Tx) stage 120, and a phase locked loop (PLL) 125. The serializer 115 is configured to serialize input parallel data $D_0$ to $D_{N-1}$ into a serial data $D_{SER}$ based on a transmit clock signal $f_{TX}$. The PLL 125 is configured to generate the transmit clock signal $f_{TX}$ that is phase/frequency locked to a reference clock signal $f_{REF}$. The transmitter (Tx) stage 120, which may include one or more cascaded transmit drivers, is configured to power amplify the serialize data $D_{SER}$ to generate a transmit signal $V_{TX}$. The SERDES transmitter 110 is configured to provide the transmit signal $V_{TX}$ to the communication channel 130 for transmission to the SERDES receiver 150.

The SERDES receiver 150 includes a receiver (Rx) stage 155, a clock and data recovery (CDR) 165, and a deserializer 160. The receiver stage 155, which may include a variable gain amplifier (VGA), a continuous time linear equalizer (CTLE), a decision feedback equalizer (DFE), data sampler/slicer/detector, etc., is configured to receive a received signal $V_{RX}$ (which may be the transmit signal $V_{TX}$ after undergoing the transmission via the communication channel 130) and amplify, equalize, and detect data in the received signal $V_{RX}$ based on a receive clock signal $f_{RX}$ to generate a serial data $D_{SER}$. The CDR 165 is configured to generate the receive clock signal $f_{RX}$ based on the serial data $D_{SER}$. The deserializer 160 is configured to deserialize the serial data $D_{SER}$ to generate a set of parallel data $D_0$ to $D_{N-1}$.

Figure 2:
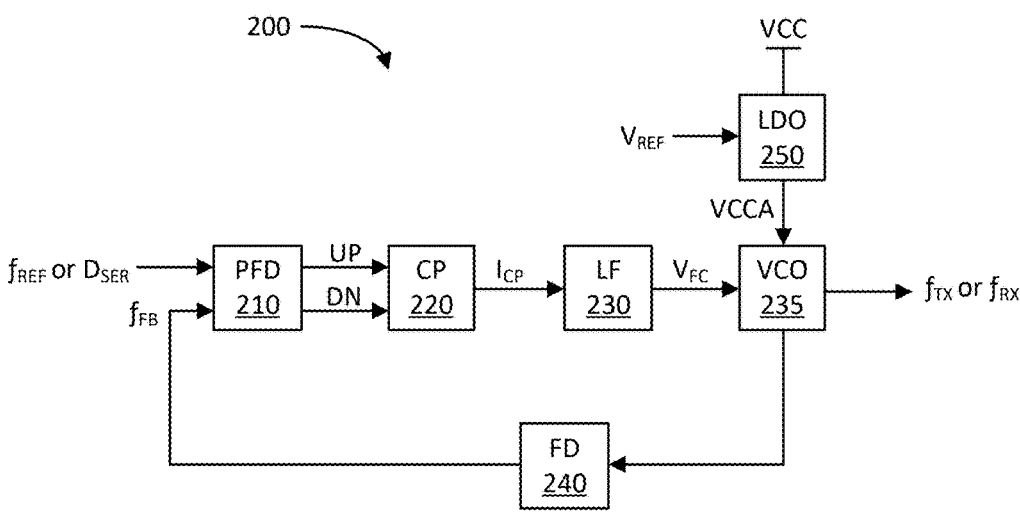
FIG. 2 illustrates a block diagram of an example phase locked loop (PLL) in accordance with another aspect of the disclosure.

FIG. 2 illustrates a block diagram of an example phase locked loop (PLL) 200 in accordance with another aspect of the disclosure. The PLL 200 may be an example more detailed implementation of the PLL 125 in SERDES transmitter 110 and/or the CDR 165 in SERDES receiver 150. In particular, the PLL 200 includes a phase/frequency detector (PFD) 210, a charge pump (CP) 220, a loop filter (LF) 230, a voltage controlled oscillator (VCO) 235, and a frequency divider (FD) 240. Additionally, the PLL 200 includes a low dropout (LDO) voltage regulator 250.

The phase/frequency detector 210 is configured to generate a charge pump control signal UP/DN based on a phase/frequency comparison of a feedback clock signal $f_{FB}$ with the reference clock signal $f_{REF}$ or the serial data $D_{SER}$. The phase/frequency detector 210 is configured to: assert/deassert the UP/DN signal based on the phase/frequency of the feedback signal $f_{FB}$ lagging the phase/frequency of the reference clock signal $f_{REF}$ or serial data $D_{SER}$; or deassert/assert the UP/DN signal based on the phase/frequency of the feedback signal $f_{FB}$ leading the phase/frequency of the reference clock signal $f_{REF}$ or serial data $D_{SER}$.

The charge pump 220 is configured to generate a current $I_{CP}$ based on the UP/DN signal from the phase/frequency detector 210. In particular, the charge pump (CP) 220 is configured to increase the current $I_{CP}$ based on the UP/DN signal being asserted/deasserted; and to decrease the current $I_{CP}$ based on the UP/DN signal being deasserted/asserted. The loop filter 230 is configured to filter (e.g., low pass filter) the charge pump current $I_{CP}$ to generate a frequency control signal $V_{FC}$. The VCO 235 is configured to generate a clock signal $f_{TX}$ or $f_{RX}$ based on the frequency control signal $V_{FC}$. The frequency divider 240 is configured to frequency divide the clock signal $f_{TX}$ or $f_{RX}$ to generate the feedback signal $f_{FB}$. The LDO voltage regulator 250 is configured to generate a regulated supply voltage VCCA for the VCO 235 from, for example, a more global (e.g., used by other circuit(s)) supply voltage VCC based on a reference voltage $V_{REF}$.

Figure 3:
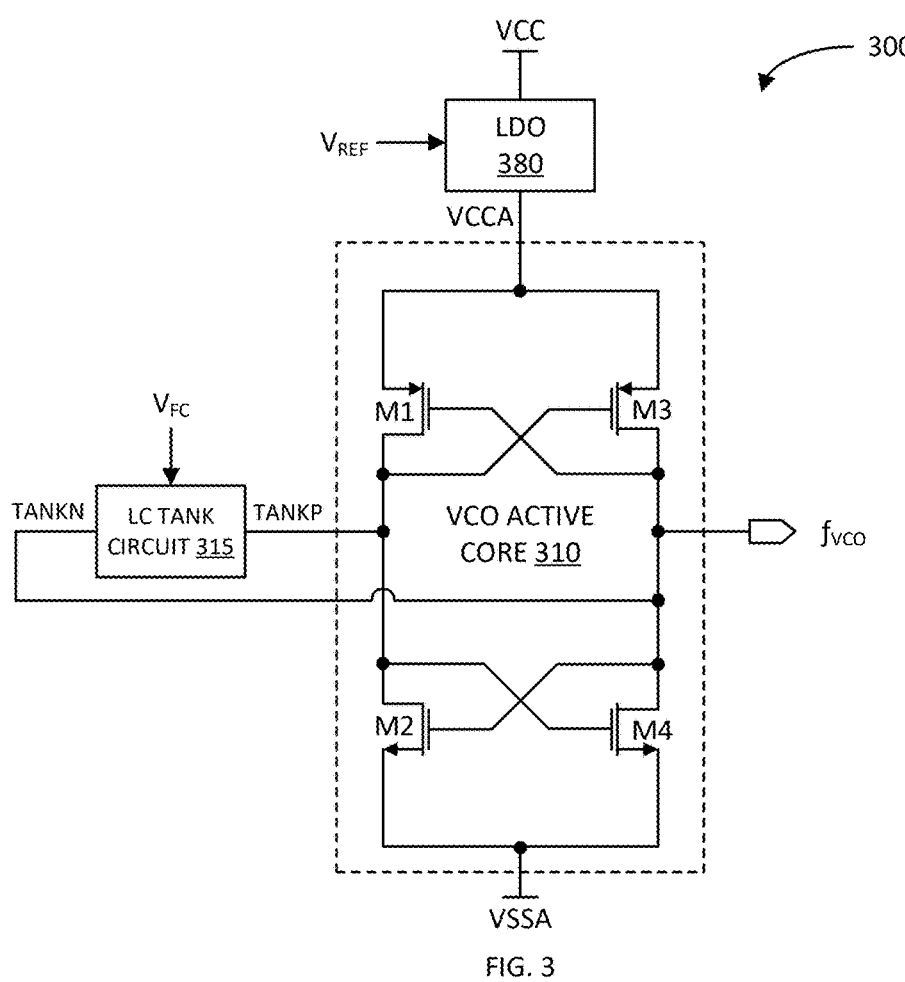
FIG. 3 illustrates a block diagram of an example voltage controlled oscillator (VCO) in accordance with another aspect of the disclosure.

FIG. 3 illustrates a block diagram of an example voltage controlled oscillator (VCO) 300 in accordance with another aspect of the disclosure. The VCO 300 may be an example implementation of the VCO 235 previously discussed. The VCO 300 includes a VCO active core 310, an inductor-capacitor (LC) tank (resonator) circuit 315, and a low dropout (LDO) voltage regulator 380.

The VCO active core 310 includes first and second cross-coupled inverters M1/M2 and M3/M4. The first inverter includes a p-channel field effect transistor (PFET) M1 and an n-channel field effect transistor (NFET) M2 coupled in series between a VCO upper voltage rail VCCA and a lower voltage rail VSSA (e.g., ground). That is, the PFET M1 includes a source coupled to the VCO upper voltage rail VCCA, and a drain coupled to a drain of the NFET M2. The NFET M2 includes a source coupled to the lower voltage rail VSSA. The second inverter includes a PFET M3 coupled in series with an NFET M4 between the VCO upper voltage rail VCCA and the lower voltage rail VSSA. The first and second inverters are cross-coupled as follows: The drains (e.g., first inverter output) of PFET M1 and NFET M2 are coupled to gates (second inverter input) of PFET M3 and NFET M4, and the drains (second inverter output) of PFET M3 and NFET M4 are coupled to gates (first inverter input) of PFET M1 and NFET M2.

The LC tank circuit 315 includes a first tank port TANKP (arbitrarily referred to as the positive (P) tank port) coupled to the output (drains) of the first inverter M1/M2, and a second tank port TANKN (arbitrarily referred to as the negative (N) tank port) coupled to the output (drains) of the second inverter M3/M4. The LC tank circuit 315 may include an inductor coupled in parallel with a capacitor, both, in turn, coupled in parallel with a varactor. The varactor may be configured to receive the frequency control signal $V_{FC}$ for controlling a capacitance of the varactor; and thereby, controlling the frequency of a clock signal $f_{VCO}$ (e.g., $f_{TX}$ or $f_{RX}$) generated by the VCO 300 (e.g., at both outputs (drains) of the cross-coupled inverters M1/M2 and M3/M4). It shall be understood that one or more cascaded buffers or inverters may be provided to output the clock signal $f_{VCO}$ while buffering the LC tank circuit 315.

The LDO voltage regulator 380 is coupled between a more global upper voltage rail VCC and the VCO upper voltage rail VCCA. The LDO voltage regulator 380 is configured to receive a reference voltage $V_{REF}$ for controlling/setting a supply voltage at the VCO upper voltage rail VCCA. The supply voltage at the VCO upper voltage rail is also referred to herein as VCCA. The VCO supply voltage VCCA may be related to the reference voltage $V_{REF}$ (e.g., being substantially the same or higher than the reference voltage $V_{REF}$ depending on the LDO configuration).

Figure 4A:
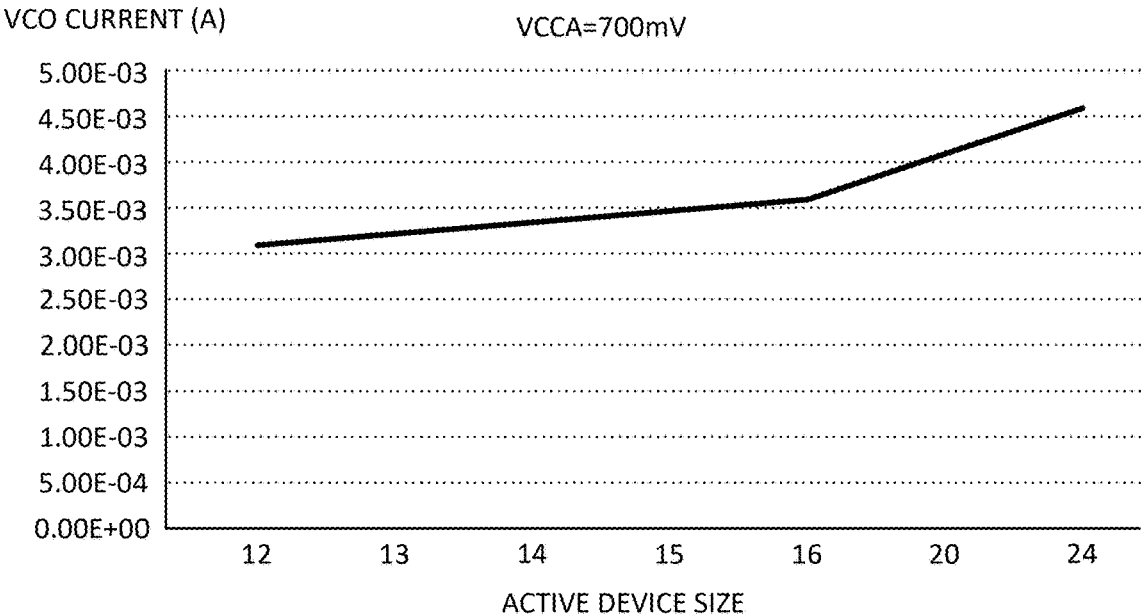
FIG. 4A illustrates a graph of an example relationship between a current versus active device size associated with the VCO of FIG. 3 in accordance with another aspect of the disclosure.

FIG. 4A illustrates a graph of an example relationship between a current versus device size associated with the VCO 300 in accordance with another aspect of the disclosure. The horizontal axis represents a normalized size of each of the FETs M1-M4 of the VCO 300 (e.g., the size of the FETs M1-M4 being substantially the same) ranging from 12 to 24. The vertical axis represents the VCO current in Ampere (A) ranging from zero (0) to 5 milliAmps (mA). The graph pertains to a VCO supply voltage VCCA of 700 milliVolts (mV). The graph illustrates that the VCO current is related (e.g., varies in the same direction) with the size of the active devices M1-M4 of the VCO 300.

Figure 4B:
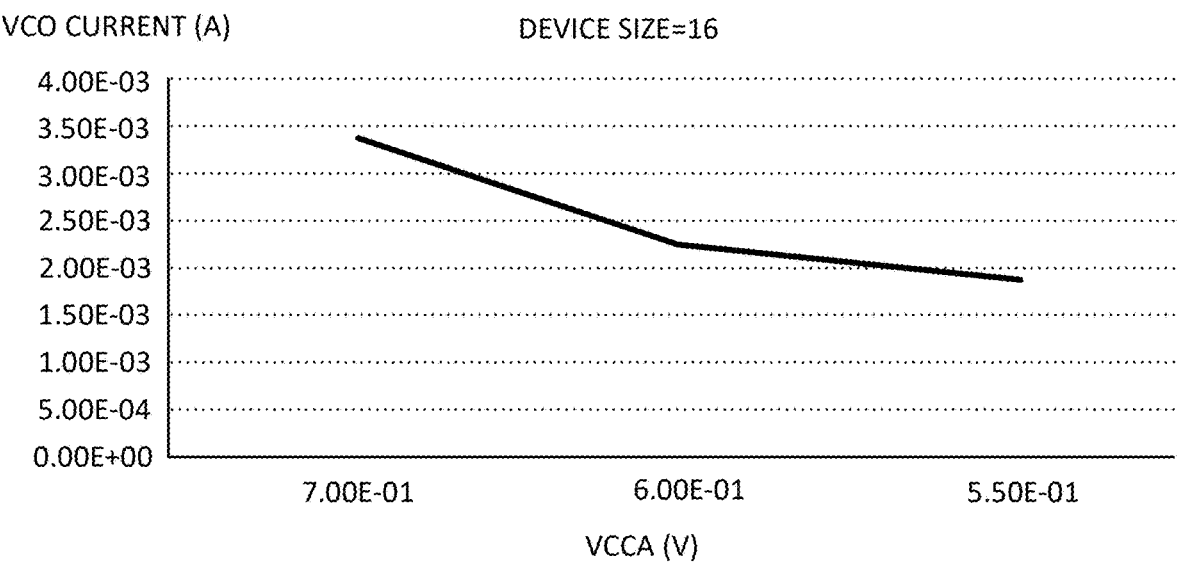
FIG. 4B illustrates a graph of an example relationship between a current versus VCO supply voltage VCCA associated with the VCO of FIG. 3 in accordance with another aspect of the disclosure.

FIG. 4B illustrates a graph of an example relationship between a current versus VCO supply voltage VCCA associated with the VCO 300 in accordance with another aspect of the disclosure. The horizontal axis represents the VCO supply voltage VCCA in Volts (V) ranging from 700 mV to 550 mV. The vertical axis represents the VCO current in Ampere (A) ranging from zero (0) to 4 mA. The graph pertains to a normalized device size of 16. The graph illustrates that the VCO current is also related (e.g., varies in the same direction) with the supply voltage VCCA of the VCO 300.

Figure 4C:
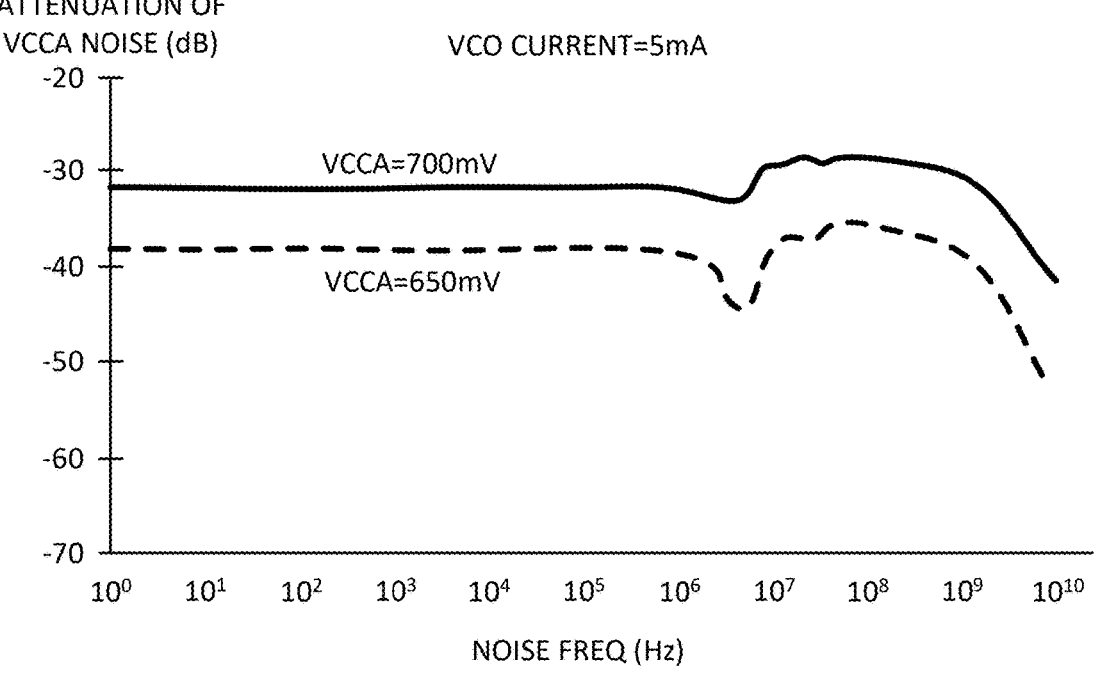
FIG. 4C illustrates a graph of an example relationship between attenuation of noise present on the VCO supply voltage VCCA versus the frequency of the supply noise associated with the VCO of FIG. 3 in accordance with another aspect of the disclosure.

FIG. 4C illustrates a graph of an example relationship between attenuation of noise present on the VCO supply voltage VCCA versus the frequency of the noise associated with the VCO 300 in accordance with another aspect of the disclosure. The horizontal axis represents the frequency of the noise on the VCO supply voltage VCCA ranging from zero (0) Hz to 10 giga Hertz (GHz). The vertical axis represents the attenuation of the supply noise on the VCO supply voltage VCCA in decibel (dB) ranging from −70 dB to −20 dB. The graph pertains to a VCO current of 5 mA. The graph illustrates that the attenuation of the supply noise on the VCO supply voltage VCCA is related (in the same direction) to the headroom (VCC-VCCA, where VCC also refers to the supply voltage at the more global upper voltage rail VCC) provided by the LDO voltage regulator 380 associated with the VCO 300. For example, if VCC is at 1.2V and VCCA is at 700 mV, then the attenuation of the noise is around −32 dB at one (1) mega Hertz (MHz). Whereas, if VCC is at 1.2V and VCCA is at 650 mV (e.g., 50 mV more headroom), the attenuation of the noise is around −38 dB.

Based on the aforementioned graphs, the size of the devices of the VCO active core 310 may be set to achieve the desired power consumption (e.g., current drawn by the VCO active core 310) and the VCO supply voltage VCCA. For example, according to the VCO current versus active device size graph depicted in FIG. 4A, a device size of 16 may dictate a VCO current of 3.5 mA. According to the VCO current versus VCO supply voltage VCCA graph depicted in FIG. 4B, a VCO current of 3.5 mA may dictate a VCO supply voltage of 700 mV. Then, according to the attenuation of the supply noise versus the noise frequency of FIG. 4C, the supply voltage of 700 mV may result in a VCCA supply noise of −32 dB. If more attenuation of the supply noise is desired (e.g., −38 dB at one (1) mega Hertz (MHz)), the supply voltage VCCA may be reduced to 650 mV, and the effective active device size may need to be increased (e.g., to 18).

The aforementioned parameters may pertain to a particular integrated circuit (IC) chip manufactured by a foundry (typically referred to as post-silicon result). But with process variation, the aforementioned parameters may not pertain to the same IC chips manufactured by the foundry. Accordingly, it may be desirable for the active device size of the VCO active core 310 to be programmable so as to achieve the desired power consumption and supply noise parameters post-silicon to account for process variation as well as using the VCO 300 for different applications.

Figure 5A:
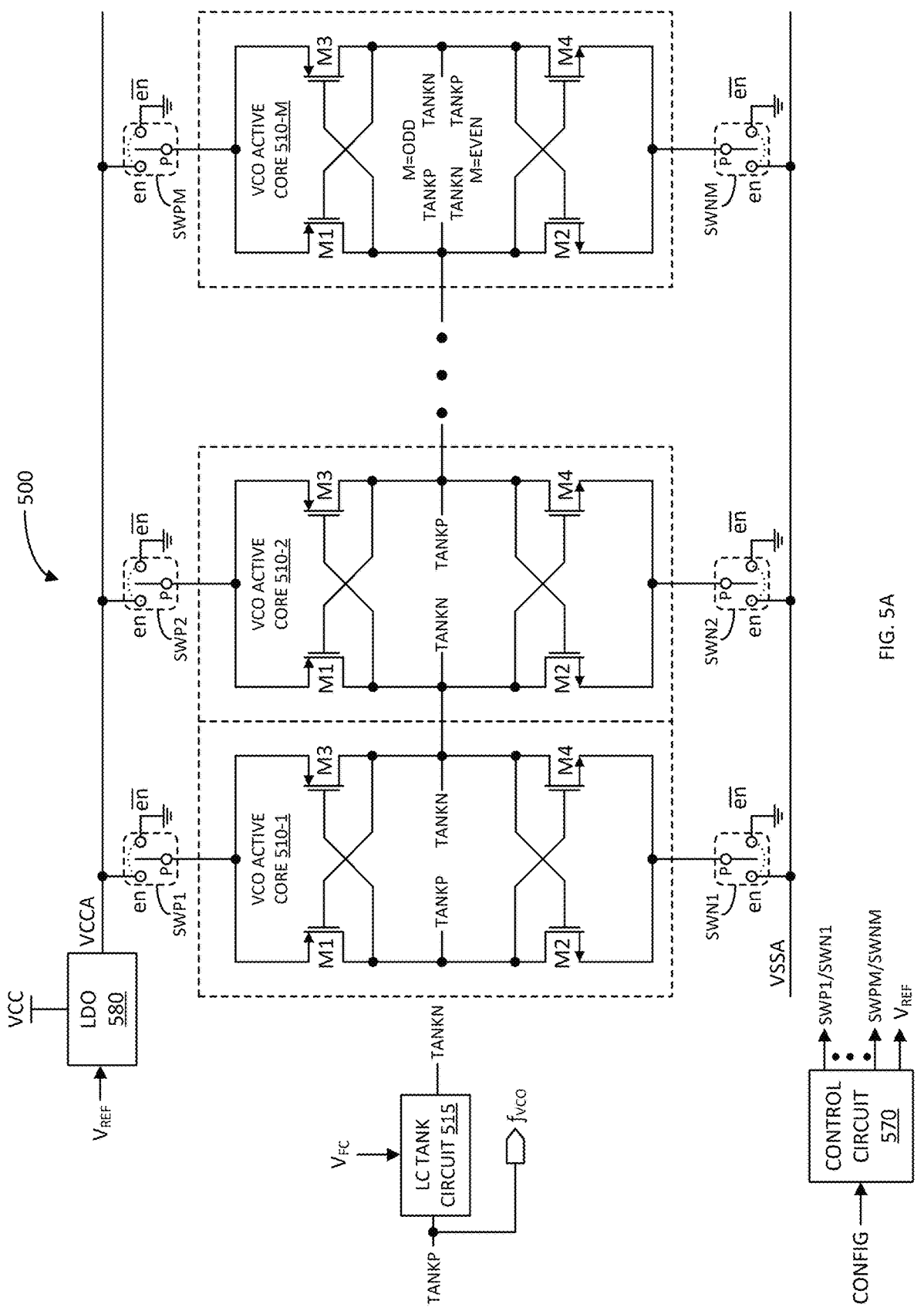
FIG. 5A illustrates a block diagram of another example voltage controlled oscillator (VCO) in accordance with another aspect of the disclosure.

FIG. 5A illustrates a block diagram of another example voltage controlled oscillator (VCO) 500 in accordance with another aspect of the disclosure. As discussed further herein, the VCO 500 includes "knobs" for selecting the effective device size and the supply voltage VCCA of the VCO 500 to achieve the desired "post-silicon" power consumption and VCO supply voltage VCCA noise.

The VCO 500 includes a set of M VCO active core circuits 510-1 to 510-M, an LC tank (resonator) 515, a first set of M switching devices SWP1 to SWPM, a second set of M switching devices SWN1 to SWNM, an LDO voltage regulator 580, and a control circuit 570. The variable M may be an integer of two (2) or more. Each of the set of VCO active cores 510-1 to 510-M may be implemented per VCO active core 310, VCO active core 710-0 (discussed further herein), or other VCO active core configuration.

The LC tank 515 includes a first port TANKP and a second port TANKP. For efficiency in circuit layout, the first port TANKP of the LC tank 515 may be coupled alternatively to the nodes between M1/M2 and M3/M4 for VCO active cores 510-1 to 510-M. The second port TANKN of the LC tank 515 may be coupled alternatively to the nodes between M3/M4 and M1/M2 for VCO active cores 510-1 to 510-M. According to this coupling configuration, the first port TANKP and the second port TANKN may be respectively coupled to the nodes between M1/M2 and M3/M4 of VCO active core 510-M if M is odd, or respectively coupled to the nodes between M3/M4 and M1/M2 of VCO active core 510-M if M is even.

The LC tank 515 may include an inductor coupled in parallel with a capacitor, both, in turn, coupled in parallel with a varactor. The varactor may be configured to receive the frequency control signal $V_{FC}$ for controlling a capacitance of the varactor; and thereby, controlling the frequency of a clock signal $f_{VCO}$ (e.g., $f_{TX}$ or $f_{RX}$) generated by the VCO 500 (e.g., generated at both outputs (drains) of the cross-coupled inverters M1/M2 and M3/M4). The output clock signal $f_{VCO}$ of the VCO 500 may be taken off either the first tank port TANKP or the second tank port TANKN, which may be buffered using a set of one or more cascaded buffers or inverters.

The LDO voltage regulator 580 is coupled between a more global upper voltage rail VCC and a VCO upper voltage rail VCCA. The LDO voltage regulator 580 is configured to receive a reference voltage $V_{REF}$ for setting the VCO supply voltage (also referred to as VCCA) at the VCO upper voltage rail VCCA. The first set of switching devices SWP1 to SWPM, which may each be implemented as a single pole double throw (SPDT) switching device, include first (enable) terminals ("en") coupled to the VCO upper voltage rail VCCA, second (disable) terminals ("en̅") coupled to ground, and pole (P) terminals coupled to the sources of the corresponding PFETs M1 and M3 of the VCO active cores 510-1 to 510-M, respectively. Each of the first set of switching devices SWP1 to SWPM may be implemented using FET type devices.

The second set of switching devices SWN1 to SWNM, which may each be implemented as a SPDT switching device, include first terminals ("en") coupled to the lower voltage rail VSSA, second terminals ("en̅") coupled to ground, and pole (P) terminals coupled to the sources of the corresponding NFETs M2 and M4 of the VCO active cores 510-1 to 510-M, respectively. The second set of switching devices SWN1 to SWNM may be optional if the lower voltage rail VSSA also corresponds to ground. Each of the second set of switching devices SWN1 to SWNM may be implemented using FET type devices.

The control circuit 570 includes an input configured to receive a VCO configuration parameter. The VCO configuration parameter may be based on user preference, a control loop (e.g., as discussed further herein), and/or other factors. The control circuit 670 is configured to set the state (e.g., the P terminal coupled to the en terminal or the P terminal coupled to the en̅ terminal) of the first set of switching devices SWP1-SWPM and the second set of switching devices SWN1-SWNM, and the LDO reference voltage $V_{REF}$ based on the VCO configuration parameter. If the P terminal is coupled to the en terminal, the corresponding VCO active core is activated; otherwise, if the P terminal is coupled to the $\overline{en}$ terminal, the corresponding active core is deactivated.

The VCO configuration parameter may be configured to set the effective active device size of the VCO 500 by selectively coupling one or more of the VCO active cores 510-1 to 510-M to the VCO upper voltage rail VCCA and optionally to the lower voltage rail VSSA. For example, the size of the active devices M1-M4 of the set of VCO active devices 510-1 to 510-M may be equally-weighted, binary-weighted, or weighted in other manners. Thus, by selectively coupling more/less of the VCO active cores 510-1 to 510-M to the VCO upper voltage rail VCCA and optionally to the lower voltage rail VSSA, the effective active device size may be increased/decreased. The VCO configuration parameter may also be controlled to adjust the LDO reference voltage $V_{REF}$.

As previously discussed, the effective active device size and the LDO reference voltage $V_{REF}$ may be used to set, post-silicon, the power consumption and the VCCA supply noise of the VCO 500. For example, the VCO supply voltage VCCA may be set to achieve a desired supply noise on the VCO local upper voltage rail VCCA. The VCO supply voltage VCCA may be set by the control circuit 570 setting the LDO reference voltage $V_{REF}$. The VCO supply voltage VCCA may dictate the current consumed by the VCO 500. And the current consumed by the VCO 500 may dictate the effective active device size of the VCO 500.

Figure 5B:
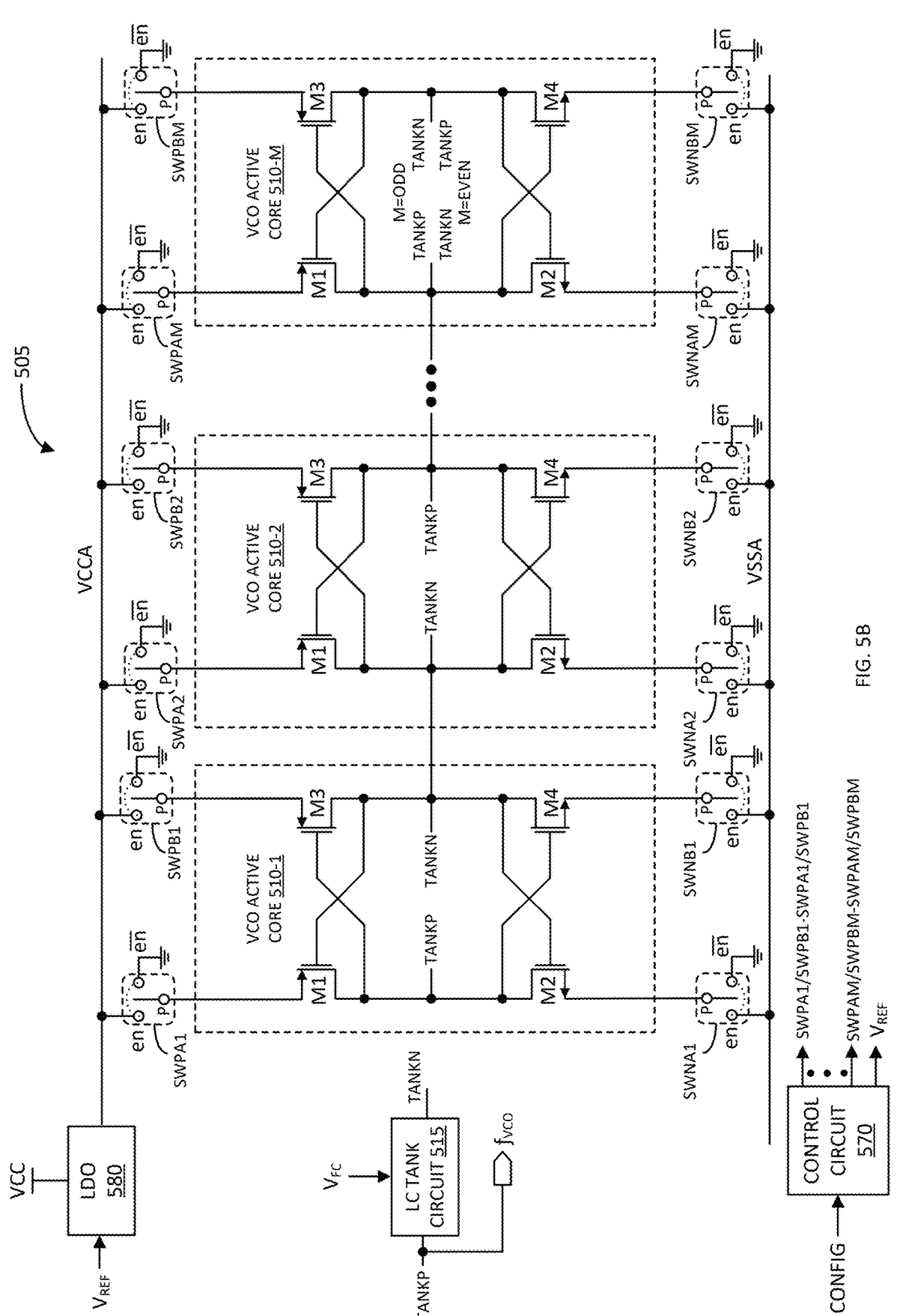
FIG. 5B illustrates a block diagram of another example voltage controlled oscillator (VCO) in accordance with another aspect of the disclosure.

FIG. 5B illustrates a block diagram of another example voltage controlled oscillator (VCO) 505 in accordance with another aspect of the disclosure. The VCO 505 is a variation of the VCO 500. That is, the VCO 505 includes the same elements as the VCO 500 as indicated by the same reference numbers. The VCO 505 differs from VCO 500 in that it includes positive and negative switching devices for each leg of each VCO active core.

For example, the VCO 505 includes a first set of SPDT switching devices SWPA1 to SWPAM including enable (en) terminals coupled to the VCO upper supply voltage rail VCCA, disable ($\overline{en}$) terminals coupled to ground, and pole (P) terminals coupled to sources of the corresponding PFETs M1 of the set of VCO active cores 510-1 to 510-M, respectively. The VCO 505 includes a second set of SPDT switching devices SWPB1 to SWPBM including enable (en) terminals coupled to the VCO upper supply voltage rail VCCA, disable ($\overline{en}$) terminals coupled to ground, and pole (P) terminals coupled to sources of the corresponding PFETs M3 of the set of VCO active cores 510-1 to 510-M, respectively.

The VCO 505 includes a third set of SPDT switching devices SWNA1 to SWNAM including enable (en) terminals coupled to the VCO lower supply voltage rail VSSA, disable ($\overline{en}$) terminals coupled to ground, and pole (P) terminals coupled to sources of the corresponding NFETs M2 of the set of VCO active cores 510-1 to 510-M, respectively. The VCO 505 includes a fourth set of SPDT switching devices SWNB1 to SWNBM including enable (en) terminals coupled to the VCO lower supply voltage rail VSSA, disable ($\overline{en}$) terminals coupled to ground, and pole (P) terminals coupled to sources of the corresponding NFETs M4 of the set of VCO active cores 510-1 to 510-M, respectively.

Similarly, the control circuit 670 is configured to control the states of the first, second, third and fourth sets of SPDT switching devices SWPA1 to SWPAM, SWPB1 to SWPBM, SWNA1 to SWNAM, and SWNB1 to SWNBM to activate/deactivate the set of VCO active cores 510-1 to 510-M to control the effective active device size based on the received configuration parameter, as previously discussed.

Figure 6A:
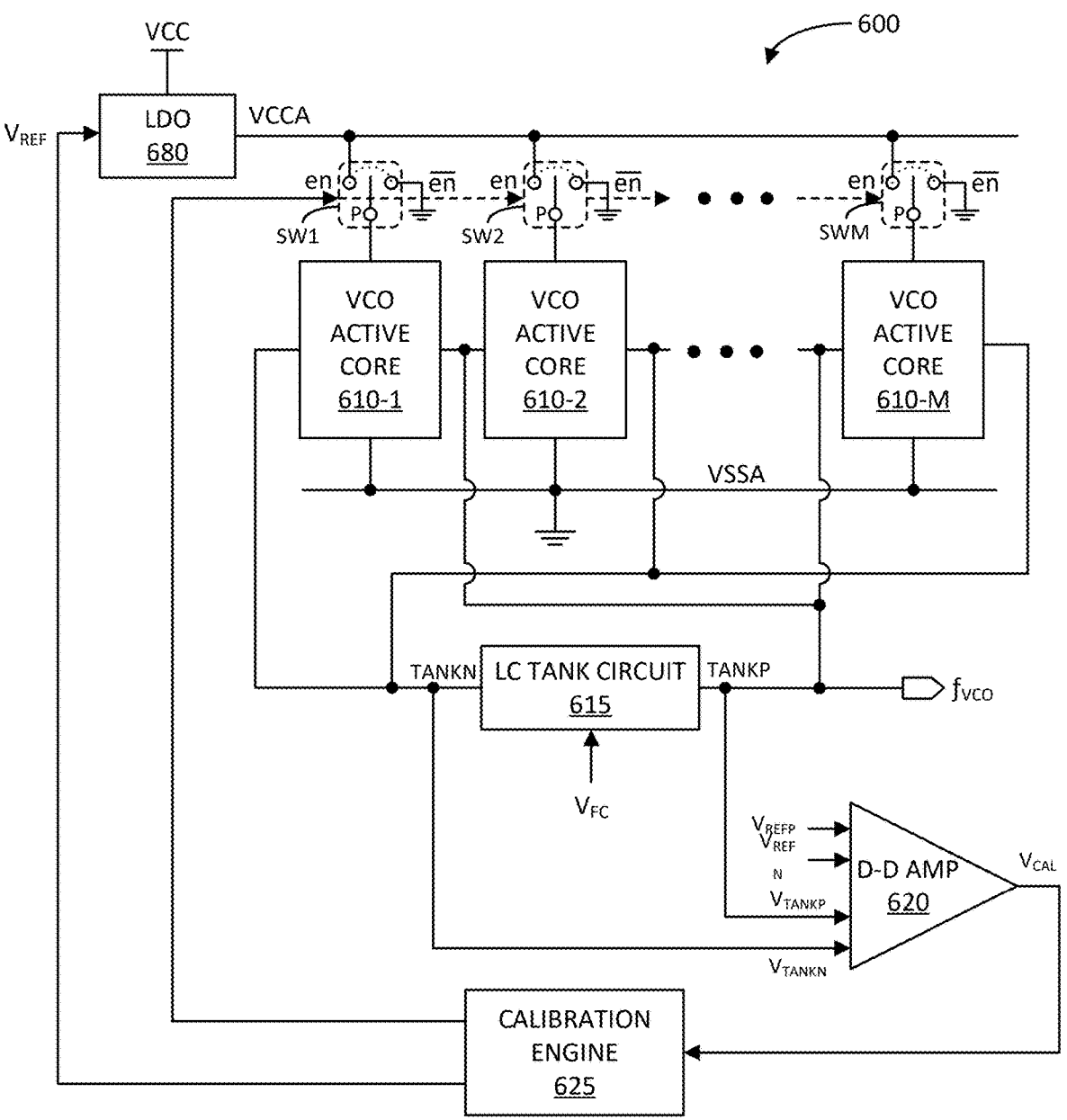
FIG. 6A illustrates a block diagram of another example voltage controlled oscillator (VCO) in accordance with another aspect of the disclosure.

FIG. 6A illustrates a block diagram of another example voltage controlled oscillator (VCO) 600 in accordance with another aspect of the disclosure. As previously mentioned, the VCO 600 employs a closed loop system for controlling the effective active device size and the LDO reference voltage $V_{REF}$ of the VCO 600 for setting its power consumption and VCO supply voltage noise characteristic.

The VCO 600 includes a set of M VCO active cores 610-1 to 610-M, where M is an integer of two (2) or more. Each of the set of M VCO active cores 610-1 to 610-M may be implemented per VCO active core 310 previously discussed, or per any of the VCO active cores 710-0, 710-1 discussed further herein, or other VCO active core configuration. The VCO 600 includes a voltage regulator 680, such as a low dropout (LDO) voltage regulator, coupled between a more global upper voltage rail VCC and a VCO upper voltage rail VCCA. The LDO voltage regulator 680 may be configured to receive a reference voltage $V_{REF}$ for setting the supply voltage VCCA at the VCO upper voltage rail VCCA. The VCO 600 further includes a set of switching devices SW1 to SWM, which may each be implemented structurally or functionally as a SPDT switching device, including en (enable) terminals coupled to the VCO upper voltage rail VCCA, $\overline{en}$ (disable) terminals coupled to ground, and pole (P) terminals coupled to the set of M VCO active cores 610-1 to 610-M, respectively. The set of M VCO active cores 610-1 to 610-M are also coupled to the lower voltage rail VSSA, which in this example, coincides with ground. Accordingly, a second set of SPDT switching devices may not be needed for VCO 600. However, it shall be understood that the if the lower voltage rail VSSA is not coupled to ground, the VCO 600 may include a set of SPDT switching devices between the VCO active cores 610-1 to 610-M similar to VCO 500.

The VCO 600 further includes an LC tank circuit 615 including a first port TANKN and a second port TANKP coupled to respective outputs of cross-coupled devices of the set of M VCO active cores 610-1 to 610-M, respectively. The LC tank circuit 615 may include an inductor coupled in parallel with a capacitor, both, in turn, coupled in parallel with a varactor. The varactor may be configured to receive the frequency control signal $V_{FC}$ for controlling a capacitance of the varactor; and thereby, controlling the frequency of a clock signal $f_{VCO}$ (e.g., $f_{TX}$ or $f_{RX}$) generated by the VCO 600. The output clock signal $f_{VCO}$ of the VCO 600 may be taken off either the first tank port TANKP or the second tank port TANKN, which may be buffered using a set of one or more cascaded buffers or inverters.

For providing closed-loop control of the effective active device size of the VCO 600 and the LDO reference voltage $V_{REF}$ for power consumption and supply noise control as previously discussed, the VCO 600 further includes a differential difference amplifier (D-D Amp) 620 and a calibration engine 625. The differential difference amplifier 620 is configured to compare a difference between the voltages $V_{TANKP}$ and $V_{TANKN}$ at the respective TANKP and TANKN ports of the LC tank circuit 615, and a difference between a positive reference voltage $V_{REFP}$ and a negative reference voltage $V_{REEN}$. The differential difference amplifier 620 is configured to generate a calibration voltage $V_{CAL}$ based on the aforementioned comparison.

The calibration engine 625 is configured to control the LDO reference voltage $V_{REF}$ (e.g., to control the VCO supply voltage VCCA) and the set of M switching devices SW1 to SWM (e.g., to set the effective active device size of the VCO 600). As previously discussed, the calibration engine 625 increases the effective active device size by activating more VCO active cores 610-1 to 610-M. Also, as previously discussed, if the P terminal is coupled to the en terminal, the corresponding VCO active core is activated; otherwise, if the P terminal is coupled to the en terminal, the corresponding active core is deactivated. A calibration engine, as used herein, is any type of digital processing unit including any one or more of the following: a processor, microprocessor, microcontroller, field programmable gate array, finite state machine (FSM), etc., that can be configured to execute or perform a calibration algorithm. The differential difference amplifier 620 and the calibration engine 625 may be considered a control circuit similar to control circuit 570.

Figure 6B:
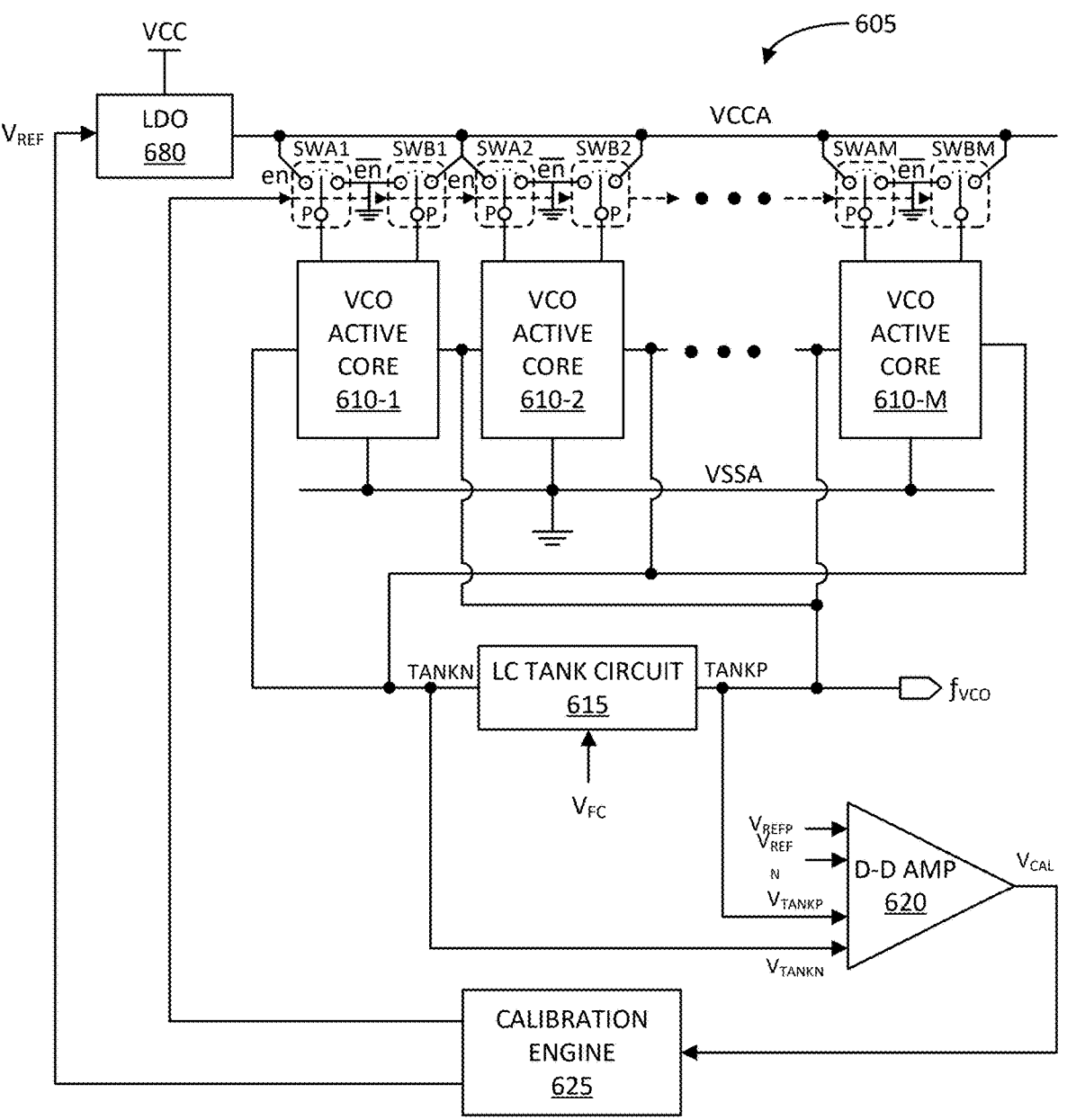
FIG. 6B illustrates a block diagram of another example voltage controlled oscillator (VCO) in accordance with another aspect of the disclosure.

FIG. 6B illustrates a block diagram of another example voltage controlled oscillator (VCO) 605 in accordance with another aspect of the disclosure. The VCO 605 is a variation of the VCO 600. That is, the VCO 605 includes the same elements as the VCO 600 as indicated by the same reference numbers. The VCO 605 differs from VCO 600 in that it includes positive switching devices for each leg of each VCO active core.

For example, the VCO 605 includes a first set of SPDT switching devices SWAI to SWAM including enable (en) terminals coupled to the VCO upper supply voltage rail VCCA, disable (en) terminals coupled to ground, and pole (P) terminals coupled to first legs of the set of VCO active cores 510-1 to 510-M, respectively. The VCO 605 includes a second set of SPDT switching devices SWB1 to SWBM including enable (en) terminals coupled to the VCO upper supply voltage rail VCCA, disable (en) terminals coupled to ground, and pole (P) terminals coupled to second legs of the set of VCO active cores 510-1 to 510-M, respectively. The set of M VCO active cores 610-1 to 610-M are also coupled to the lower voltage rail VSSA, which in this example, coincides with ground. Accordingly, third and fourth sets of SPDT switching devices may not be needed for selectively coupling both legs of the VCO active cores 510-1 to 510-M to VSSA or ground. However, it shall be understood that if the lower voltage rail VSSA is not coupled to ground, the VCO 600 may include such third and fourth sets of SPDT switching devices similar to VCO 505.

The calibration engine 625 is configured to control the states of the first and second sets of SPDT switching devices SWAI to SWAM and SWB1 to SWBM to activate/deactivate the set of VCO active cores 610-1 to 610-M to control the effective active device size based on the received configuration parameter, as previously discussed.

Figure 7:
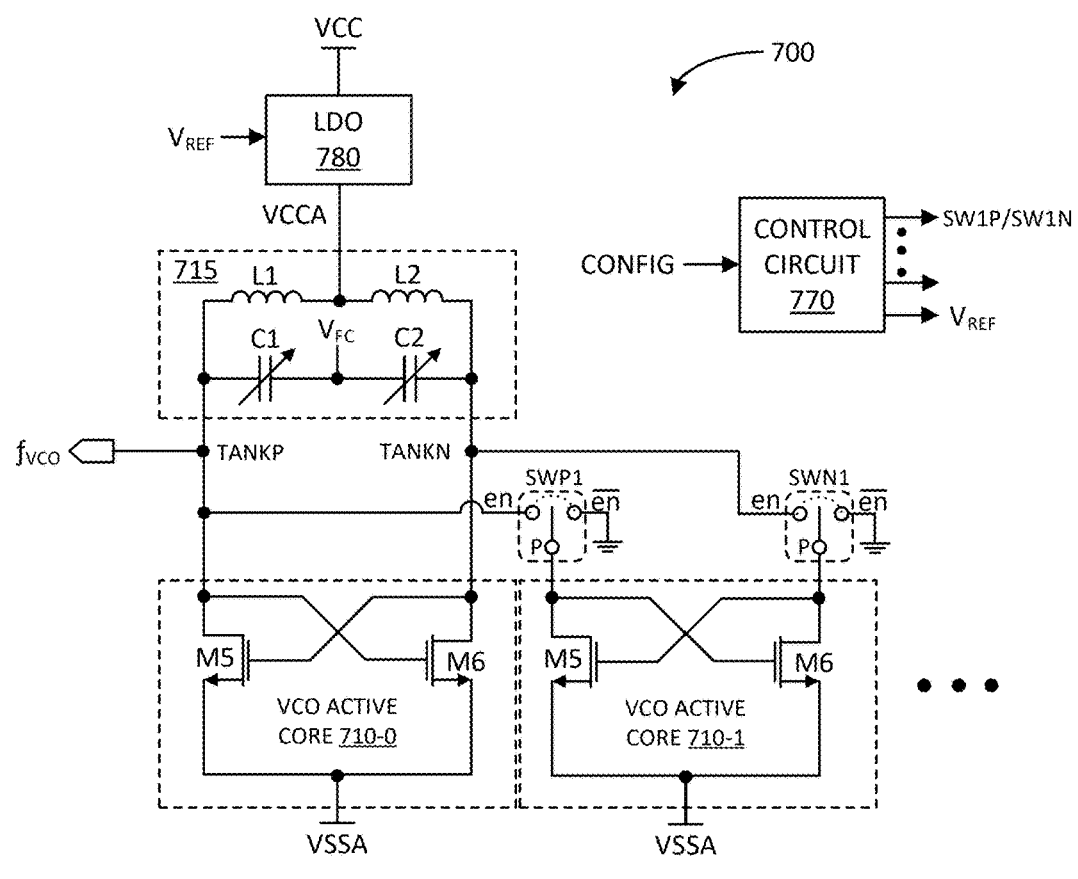
FIG. 7 illustrates a block diagram of another example voltage controlled oscillator (VCO) in accordance with another aspect of the disclosure.

FIG. 7 illustrates a block diagram of another example voltage controlled oscillator (VCO) 700 in accordance with another aspect of the disclosure. The VCO 700 includes a different type of VCO active core than the other VCOs previously discussed. It shall be understood that the VCOs described herein may use different types of VCO active cores.

In particular, the VCO 700 includes an LDO voltage regulator 780, an LC tank circuit 715, a set of VCO active cores 710-0, 710-1, etc., and a control circuit 770. Each of the VCO active cores 710-0, 710-1, etc. includes cross-coupled NFETs M5 and M6. That is, the NFET M5 includes a drain (output) coupled to a gate (input) of NFET M6; the NFET M6 includes a drain (output) coupled to a gate (input) of NFET M5. The NFETs M5 and M6 include sources coupled to a lower voltage rail VSSA ground, or may include at least one set of SPDT switching devices for selectively coupling the sources of NFETs M5 and M5 for each VCO active core 710-1, etc. to either VSSA or ground, as per VCO 500 and 505 as previously discussed. The VCO 700 further includes SPDT switching devices SWP1 and SWN1 including en (enable) terminals coupled to the cross-coupled outputs of the VCO active core 710-0, en (disable) terminals coupled to ground, and P terminals coupled to the respective outputs of any additional VCO active core(s) 710-1, etc.

The LDO voltage regulator 780 is coupled between a more global upper voltage rail VCC and a VCO upper voltage rail VCCA. The LDO voltage regulator 780 is configured to receive a reference voltage $V_{REF}$ for setting the VCO supply voltage VCCA as previously discussed. The LC tank circuit 715 includes first and second inductors L1 and L2 coupled between the VCO upper voltage rail VCCA and the cross-coupled outputs TANKP/TANKN of the VCO active core 710-0. The LC tank circuit 715 further includes first and second variable capacitors C1 and C2 coupled in series between the cross-coupled outputs TANKP/TANKN of the VCO active core 710. A frequency control voltage $V_{FC}$ may be applied to a node between the first and second variable capacitors C1 and C2 for tuning the capacitors to achieve a desired frequency of the output clock signal $f_{VCO}$ of the VCO 700 (e.g., under the control of a PLL). As previously discussed, each of the first and second variable capacitors C1 and C2 may include a varactor for controlling the capacitance for frequency tuning purpose.

The control circuit 770 includes an input configured to receive a VCO configuration parameter. The VCO configuration parameter may be based on user preference, a control loop (as discussed herein), and/or other factors. Based on the VCO configuration parameter, the control circuit 770 is configured to set the state (e.g., the P terminal coupled to the en terminal or the P terminal coupled to the en terminal) of the switching devices SWP1/SWN1, etc. to activate/deactivate any additional VCO active cores 710-1, etc. to set the effective active device size of the VCO 700. Also based on the VCO configuration parameter, the control circuit 770 may set the LDO reference voltage $V_{REF}$ to set the VCO supply voltage VCCA. As previously discussed, the control circuit 770 performs these controls for controlling the power consumption and supply noise characteristic of the VCO 700 (e.g., per a post-silicon calibration procedure).

Figure 8:
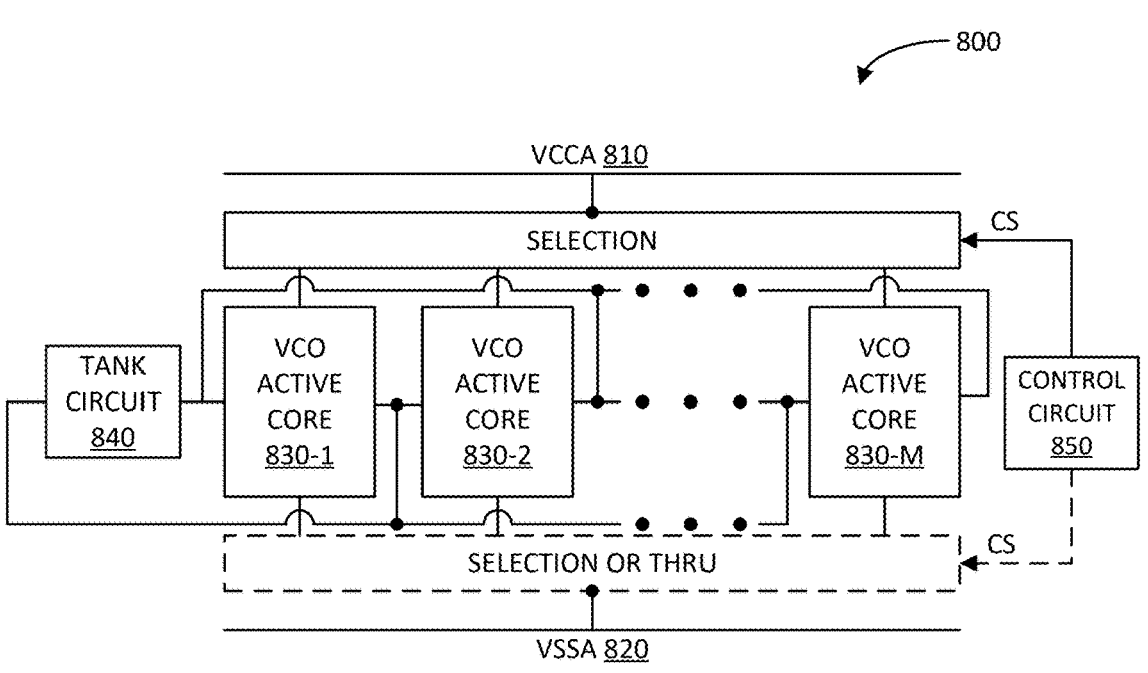
FIG. 8 illustrates a block diagram of an example apparatus (e.g., a voltage controlled oscillator (VCO)) in accordance with another aspect of the disclosure.

FIG. 8 illustrates a block diagram of another example apparatus (e.g., a voltage controlled oscillator (VCO)) 800 in accordance with another aspect of the disclosure. The apparatus 800 includes a first upper voltage rail VCCA 810 and a lower voltage rail VSSA 820. The apparatus 800 further includes a set of voltage controlled oscillator (VCO) active cores 830-1 to 830-M, wherein one or more of the set of VCO active cores 830-1 to 830-M is selectively coupled to the first upper voltage rail VCCA 810 based on a control signal (CS), wherein the set of the VCO active cores 830-1 to 830-M are coupled to the lower voltage rail VSSA 820 or the one or more of the set of VCO active cores 830-1 to 830-M is selectively coupled to the lower voltage rail VSSA 820 based on the control signal (CS).

FIG. 9 illustrates a flow diagram of an example method 900 of generating a clock signal in accordance with another aspect of the disclosure. The method 900 includes operating a first set of switching devices to selectively couple one or more of a set of voltage controlled oscillator (VCO) active cores to a first upper voltage rail based on a configuration parameter, wherein the set of VCO active cores are coupled to a tank circuit configured to generate an output clock signal (block 910). Examples of means for operating a first set of switching devices to selectively couple one or more of a set of voltage controlled oscillator (VCO) active cores to a first upper voltage rail based on a configuration parameter include any of the control circuits 570, 620/625, 770, or 850 described herein.

The method 900 further includes setting a reference voltage applied to a low dropout (LDO) voltage regulator based on the configuration parameter, the LDO voltage regulator coupled between a second upper voltage rail and the first upper voltage rail (block 920). Examples of means for setting a reference voltage applied to a low dropout (LDO) voltage regulator based on the configuration parameter include any of the control circuits 570, 620/625, 770, or 850 described herein.

The following provides an overview of aspects of the present disclosure:

Aspect 1: An apparatus, comprising: a first upper voltage rail; a lower voltage rail; a set of voltage controlled oscillator (VCO) active cores, wherein one or more of the VCO active cores is selectively coupled to the first upper voltage rail based on a control signal, wherein the set of the VCO active cores are coupled to the lower voltage rail or the one or more of the VCO active cores is selectively coupled to the lower voltage rail based on the control signal; and a tank circuit coupled to the set of VCO active cores.

Aspect 2: The apparatus of aspect 1, further comprising a control circuit configured to generate the control signal.

Aspect 3: The apparatus of aspect 2, further comprising a first set of switching devices coupled between the first upper voltage rail and the set of VCO active cores, respectively, wherein the control circuit is coupled to the first set of switching devices.

Aspect 4: The apparatus of aspect 3, wherein the first set of switching devices comprise at least one set of single pole double throw (SPDT) switching devices including enable terminals coupled to the first upper voltage rail, disable terminals coupled to ground, and pole terminals coupled to the set of VCO active cores, respectively.

Aspect 5: The apparatus of any one of aspects 2-4, further comprising a second set of switching devices coupled between the set of VCO active cores and the lower voltage rail, respectively, and wherein the control circuit is coupled to the second set of switching devices.

Aspect 6: The apparatus of aspect 5, wherein the second set of switching devices comprise at least one set of single pole double throw (SPDT) switching devices including enable terminals coupled to the lower voltage rail, disable terminals coupled to ground, and pole terminals coupled to the set of VCO active cores, respectively.

Aspect 7: The apparatus of aspect 6, further comprising a low dropout (LDO) voltage regulator coupled between a second upper voltage rail and the first upper voltage rail, wherein the LDO voltage regulator is configured to receive a reference voltage for controlling a supply voltage at the first upper voltage rail.

Aspect 8: The apparatus of aspect 7, further comprising a control circuit configured to control the reference voltage.

Aspect 9: The apparatus of any one of aspects 1-8, wherein the tank circuit comprises an inductor-capacitor (LC) tank circuit.

Aspect 10: The apparatus of any one of aspects 1-9, wherein each of the set of VCO active cores comprises cross-coupled field effect transistors (FETs) including drains coupled to first and second ports of the tank circuit, respectively.

Aspect 11: The apparatus of aspect 10, wherein the cross-coupled FETs each comprises an n-channel field effect transistor (FET).

Aspect 12: The apparatus of any one of aspects 1-11, wherein each of the set of VCO active cores comprises cross-coupled inverters including outputs coupled to first and second ports of the tank circuit, respectively.

Aspect 13: The apparatus of any one of aspects 1-12, further comprising a control circuit including: a differential difference amplifier configured to generate a calibration signal based on a first difference between first and second voltages at respective ports of the tank circuit, and a second difference between first and second reference voltages; and a calibration engine configured to generate the control signal based on the calibration signal.

Aspect 14: The apparatus of aspect 13, further comprising a low dropout (LDO) voltage regulator coupled between a second upper voltage rail and the first upper voltage rail, wherein the LDO voltage regulator is configured to receive a reference voltage for controlling a supply voltage at the first upper voltage rail, and wherein the calibration engine is configured to control the reference voltage based on the calibration signal.

Aspect 15: The apparatus of any one of aspects 1-14, wherein the tank circuit is configured to receive a frequency control signal in accordance with an operation of a phase locked loop (PLL).

Aspect 16: A method, comprising: operating a first set of switching devices to selectively couple one or more of a set of voltage controlled oscillator (VCO) active cores to a first upper voltage rail based on a configuration parameter, wherein the set of VCO active cores are coupled to a tank circuit; and setting a reference voltage applied to a low dropout (LDO) voltage regulator based on the configuration parameter, the LDO voltage regulator coupled between a second upper voltage rail and the first upper voltage rail.

Aspect 17: The method of aspect 16, wherein the configuration parameter is based on a power consumption of the set of VCO active cores.

Aspect 18: The method of aspect 16 or 17, wherein the configuration parameter is based on a noise in a supply voltage at the first upper voltage rail.

Aspect 19: The method of any one of aspects 16-18, wherein the configuration parameter is based on a first difference between first and second voltages at respective ports of the tank circuit, and a second difference between first and second reference voltages.

Aspect 20: The method of any one of aspects 16-19, further comprising generating a clock signal at a port of the tank circuit based on a frequency control voltage applied to the tank circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:

a first upper voltage rail;

a lower voltage rail;

a set of voltage controlled oscillator (VCO) active cores, wherein one or more of the set of VCO active cores is selectively coupled to the first upper voltage rail based on a control signal, wherein the set of the VCO active cores are coupled to the lower voltage rail or the one or more of the set of VCO active cores is selectively coupled to the lower voltage rail based on the control signal;

a tank circuit coupled to the set of VCO active cores; and a control circuit, including a differential difference amplifier configured to generate a calibration signal based on a first difference between first and second voltages at respective ports of the tank circuit, and a second difference between first and second reference voltages; and a calibration engine configured to generate the control signal based on the calibration signal.

2. The apparatus of claim 1, further comprising a control circuit configured to generate the control signal.

3. The apparatus of claim 2, further comprising a first set of switching devices coupled between the first upper voltage rail and the set of VCO active cores, respectively, wherein the control circuit is coupled to the first set of switching devices.

4. The apparatus of claim 3, wherein the first set of switching devices comprise at least one set of single pole double throw (SPDT) switching devices including enable terminals coupled to the first upper voltage rail, disable terminals coupled to ground, and pole terminals coupled to the set of VCO active cores, respectively.

5. The apparatus of claim 2, further comprising a second set of switching devices coupled between the set of VCO active cores and the lower voltage rail, respectively, and wherein the control circuit is coupled to the second set of switching devices.

6. The apparatus of claim 5, wherein the second set of switching devices comprise at least one set of single pole double throw (SPDT) switching devices including enable terminals coupled to the lower voltage rail, disable terminals coupled to ground, and pole terminals coupled to the set of VCO active cores, respectively.

7. The apparatus of claim 1, further comprising a low dropout (LDO) voltage regulator coupled between a second upper voltage rail and the first upper voltage rail, wherein the LDO voltage regulator is configured to receive a reference voltage for controlling a supply voltage at the first upper voltage rail.

8. The apparatus of claim 7, further comprising a control circuit configured to control the reference voltage.

9. The apparatus of claim 1, wherein the tank circuit comprises an inductor-capacitor (LC) tank circuit.

10. The apparatus of claim 1, wherein each of the set of VCO active cores comprises cross-coupled field effect transistors (FETs) including drains coupled to first and second ports of the tank circuit, respectively.

11. The apparatus of claim 10, wherein the cross-coupled FETs each comprises an n-channel field effect transistor (FET).

12. The apparatus of claim 1, wherein each of the set of VCO active cores comprises cross-coupled inverters including outputs coupled to first and second ports of the tank circuit, respectively.

13. The apparatus of claim 1, further comprising a low dropout (LDO) voltage regulator coupled between a second upper voltage rail and the first upper voltage rail, wherein the LDO voltage regulator is configured to receive a reference voltage for controlling a supply voltage at the first upper voltage rail, and wherein the calibration engine is configured to control the reference voltage based on the calibration signal.

14. The apparatus of claim 1, wherein the tank circuit is configured to receive a frequency control signal in accordance with an operation of a phase locked loop (PLL).

15. A method, comprising:

operating a first set of switching devices to selectively couple one or more of a set of voltage controlled oscillator (VCO) active cores to a first upper voltage rail based on a configuration parameter, wherein the set of VCO active cores are coupled to a tank circuit; and setting a reference voltage applied to a low dropout (LDO) voltage regulator based on the configuration parameter, the LDO voltage regulator coupled between a second upper voltage rail and the first upper voltage rail, wherein the configuration parameter is based on a first difference between first and second voltages at respective ports of the tank circuit, and a second difference between first and second reference voltages.

16. The method of claim 15, wherein the configuration parameter is based on a power consumption of the set of VCO active cores.

17. The method of claim 15, wherein the configuration parameter is based on a noise in a supply voltage at the first upper voltage rail.

18. The method of claim 15, further comprising generating a clock signal at a port of the tank circuit based on a frequency control voltage applied to the tank circuit.

* * * * *